United States Patent
Perego (10) Patent No.: US 9,487,857 B2
(45) Date of Patent: Nov. 8, 2016

(54) MACHINE FOR PAINTING AND LINE FOR FINISHING SMALL THREE-DIMENSIONAL OBJECTS AND RELATED METHODS

(71) Applicant: TAPEMATIC S.P.A., Ornago (MB) (IT)

(72) Inventor: Luciano Perego, Merate (IT)

(73) Assignee: TAPEMATIC S.P.A., Ornago (IT)

( * ) Notice: Subject to any disclaimer, the term of this patent is extended or adjusted under 35 U.S.C. 154(b) by 854 days.

(21) Appl. No.: 13/731,047

(22) Filed: Dec. 30, 2012

(65) Prior Publication Data

US 2014/0034482 A1 Feb. 6, 2014

(30) Foreign Application Priority Data

Aug. 1, 2012 (IT) .............................. MI2012A1358

(51) Int. Cl.
| | |
|---|---|
| *C23C 14/34* | (2006.01) |
| *B05B 13/02* | (2006.01) |
| *B05C 5/00* | (2006.01) |
| *C23C 14/56* | (2006.01) |
| *B05B 15/12* | (2006.01) |

(52) U.S. Cl.
CPC ........... *C23C 14/34* (2013.01); *B05B 13/0221* (2013.01); *B05B 13/0228* (2013.01); *B05B 13/0242* (2013.01); *B05B 15/1207* (2013.01); *B05C 5/002* (2013.01); *C23C 14/566* (2013.01)

(58) Field of Classification Search
CPC .... C23C 14/34; B05B 13/0242; B05C 5/002
See application file for complete search history.

(56) References Cited

U.S. PATENT DOCUMENTS

| | | | |
|---|---|---|---|
| 3,989,001 A | 11/1976 | Brigham et al. | |
| 4,018,952 A | 4/1977 | Bringham et al. | |
| 4,416,588 A * | 11/1983 | Karliner ................... | B05B 7/32 417/199.1 |
| 5,372,473 A * | 12/1994 | Moyden ................. | B65G 65/00 414/753.1 |
| 5,487,637 A | 1/1996 | Mojden et al. | |
| 6,132,562 A * | 10/2000 | Baumecker ............ | C23C 14/56 118/715 |
| 6,156,392 A * | 12/2000 | Duffy ..................... | B05B 5/047 427/475 |
| 6,340,501 B1 | 1/2002 | Kamiyama et al. | |
| 6,395,346 B1 | 5/2002 | Duffy et al. | |
| 6,761,126 B2 | 7/2004 | Di Maio et al. | |
| 2002/0170494 A1 | 11/2002 | Di Maio et al. | |
| 2007/0048451 A1 | 3/2007 | White et al. | |
| 2011/0222993 A1* | 9/2011 | De Ruijter ............. | A61J 3/007 414/222.01 |

FOREIGN PATENT DOCUMENTS

| | | |
|---|---|---|
| EP | 0599360 A2 | 6/1994 |
| EP | 0987700 A1 | 3/2000 |
| EP | 1260276 A2 | 11/2002 |

(Continued)

*Primary Examiner* — John Brayton
(74) *Attorney, Agent, or Firm* — Pearne & Gordon LLP (57) ABSTRACT

A machine (12, 13) for painting small three-dimensional objects (2) comprises a plurality of spindles (9) equipped with holders (10) for objects (2) to be painted. A unit (15) able to rotate about an axis (16) is equipped with a plurality of seats (17) structured to receive a spindle (9). The spindle (9) is removably associable with said seat (17). An airless painting device (25) is operatively positioned at a painting station (26) designed to receive said seats (17) in sequence. First actuator means (27) drive the rotation about a painting axis (18) at least of the holder (10) when the seat is positioned at the painting station (26). Means (29) for transferring the objects (2) grip a spindle (9) positioned along a transfer line (3) and place it in one of the seats (17) and/or vice versa.

18 Claims, 7 Drawing Sheets

(56) References Cited

FOREIGN PATENT DOCUMENTS

| | | | |
|---|---|---|---|
| EP | 2002897 A1 | 12/2008 | |
| FR | 862629 A1 | 3/1941 | |
| LV | EP 0995812 A1 * | 4/2000 | ........... C23C 14/566 |
| WO | WO 00/28105 * | 5/2000 | ............. C23C 14/56 |

* cited by examiner

MACHINE FOR PAINTING AND LINE FOR FINISHING SMALL THREE-DIMENSIONAL OBJECTS AND RELATED METHODS

This invention relates to a machine and a method for painting small three-dimensional objects, such as small scent bottles, caps and the like whose characteristic dimensions are few centimeters (2-10 cm).

This invention also relates to a line and a method for finishing small three-dimensional objects.

In particular, this invention relates to an airless type painting method. The expression "airless painting device" refers to a device in which the paint is atomised by forcing it to pass at a very high pressure (around 35 bar) through a small nozzle. Therefore, air is not used to atomise the paint, and the paint is pressurised by a pump which sucks in the paint, brings it up to pressure, then sends it to the nozzle which atomises it. This type of painting allows a considerable reduction in paint overspray (limiting wastage) and excellent coverage of the object. The time required to apply the paint on the object is few seconds, that is to say 2-4 seconds, or even less than one second.

Advantageously, the paint used does not contain solvents (or in any case the solvent contained is a minimal fraction) and may be a paint containing a photoinitiator which, when subjected to electromagnetic radiation causes a chain reaction of paint cross-linking (curing).

The term "spindle" refers to an element for supporting and holding the object to be painted/finished. In particular, in the case of a cap it is an axially symmetric structure designed to receive the cap as if it were fitted on the bottle.

The machine and the method for painting according to the invention are in particular suitable for the application of primer and/or of the final protective layer in a finishing process involving the metallization of objects.

Metallization is a surface finishing process able to completely transform the surface of the object, embellishing it and enhancing its appearance, in such a way that a simple moulded item takes on more sophisticated and more precious aspects. Metallization makes it possible to perfectly imitate other types of colours, for example those obtained using the galvanic bath method, so that items made of "basic, inexpensive" material (whether plastic or metal) can be made to resemble more valuable items (for example, chromium- or gold-plated).

In particular, this invention relates to a metallizing method with a sputtering technique (cathodic atomisation). Said technique is implemented by the ejection of atoms, ions or molecular fragments from a solid material, called the target, which is bombarded with a beam of energetic particles, usually an ion plasma. The ion plasma strikes the target which, due to the collision, releases atoms and particles which recondense on the surfaces of the object to be coated. The target consists of the material to be used to coat the object.

This process is carried out in a vacuum chamber.

Usually, before metallization the object is painted with a primer to cover any surface imperfections which could compromise its appearance.

The prior art lines and methods for finishing using metallization of small three-dimensional objects involve the presence of a spray painting station for depositing the primer on the objects and a subsequent station for abatement of the solvent contained in the spray for drying the primer.

Downstream of the solvent abatement station there is a metallizing chamber where the actual metallization step takes place.

In particular, a plurality of objects is inserted in the metallizing chamber, then a vacuum is created in the chamber to allow their metallization.

Once the transfer of the micrometric layer of metal onto the objects is complete (usually requiring just a few seconds), the chamber is opened and the metallized objects removed.

The latter are sometimes further subjected to a painting process for coating them with a protective layer (or further colour).

Conventional painting machines are positioned along the transfer line and operate by spraying on a series of objects and on the elements which support them (usually rods).

Then the objects and the respective supporting elements are metallized.

Moreover, the methods and machines which implement the metallization methods described above necessitate the insertion of many objects simultaneously in the metallizing chamber, in such a way as to guarantee a certain degree of plant efficiency and productivity.

In fact, compared with the few seconds needed for the actual sputtering process, the time required for creating a vacuum in the metallizing chamber is several minutes, that is to say, at least one order of magnitude greater than the sputtering time.

Considering that the quantity of energy required for depressurising the metallizing chamber is quite significant, the need to simultaneously metallize many small three-dimensional objects is obvious.

The above makes it impossible to modulate production of metallized small three-dimensional objects as desired. Moreover, the methods and the machines which implement the prior art metallization methods described above are not able to operate continuously, necessitating the continuous presence of operators for transferring batches of objects between the operating stations and requiring considerable storage spaces for the objects to be treated, for those partly treated but still to be metallized and for those already metallized but still to be subjected to the final finishing treatment.

In this context, the technical purpose which forms the basis of this invention is to provide a machine and a method for painting small three-dimensional objects that overcomes the above mentioned drawbacks of the prior art.

Moreover, the technical purpose which forms the basis of this invention is to provide a line and a method for finishing small three-dimensional objects that overcomes the above mentioned drawbacks of the prior art.

In particular, the aim of this invention is to provide a machine and a method for painting small three-dimensional objects that performs the finishing with a continuous process independent of the transfer line from or to metallization.

Another aim of this invention is to provide a machine and a method for painting small three-dimensional objects having good flexibility and production speed.

Another aim of this invention is to provide a line and a method for finishing with metallization small three-dimensional objects which is effective and requires limited maintenance.

The technical purpose indicated and the aims specified are substantially achieved by a machine and a method for painting and a line and a method for finishing small three-dimensional objects, comprising the features described in one or more of the appended claims.

Further features and advantages of this invention are more apparent in the description below, with reference to a preferred, non-limiting, embodiment of a machine and a method for painting and a line and a method for finishing small three-dimensional objects, as illustrated in the accompanying drawings, in which.

Figure 1:
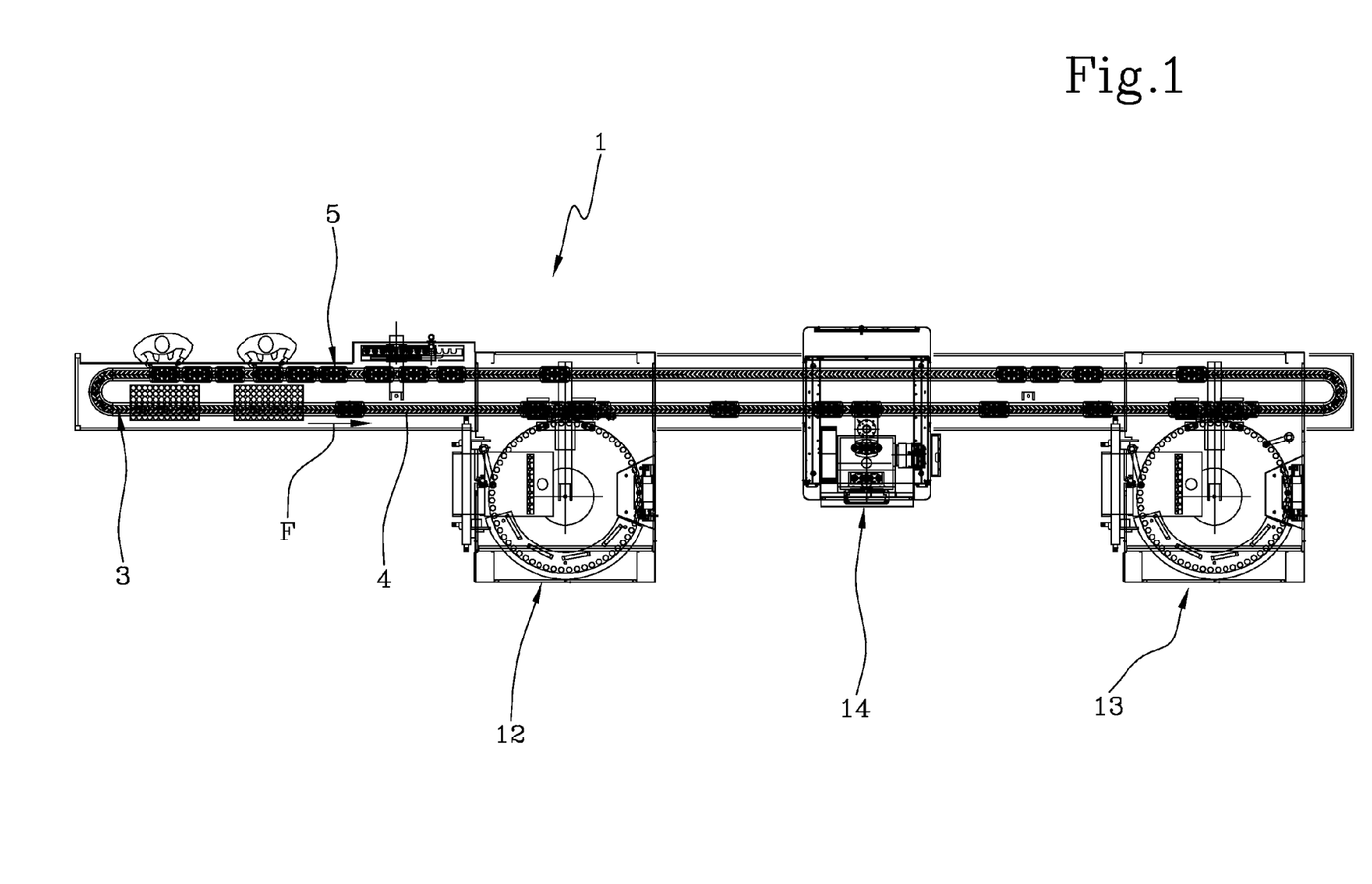
FIG. 1 is a schematic top view of a finishing line according to this invention.

With reference to the accompanying drawings, in particular FIG. 1, the numeral 1 denotes in its entirety a finishing line for objects 2, in particular small three-dimensional objects.

In general, a transfer line 3 for the objects forms a transfer path 4 along which the objects move in the direction indicated by the arrow F.

A plurality of trays 5 is able to move along the transfer line 3. Each tray is designed to receive one or more objects to be painted/finished.

FIGS. 5 to 8 show two possible embodiments of the trays 5.

A tray 5 comprises a plate 6 in which a plurality of pins is housed. For example there are four pins 7. The pins 7 are housed in a through seat of the plate 6. A pin axis of symmetry 8 is positioned perpendicularly to the plate 6.

Each pin 7 projects from the upper surface of the plate.

Each pin 7 is associated with the plate in such a way that it can rotate about its own axis of symmetry 8.

The numeral 9 denotes a spindle comprising a holder 10 for a single object to be painted/finished.

A longitudinal cavity 11 of the spindle is designed to receive a portion of the pin 7 projecting from the upper surface of the plate. The coupling between the pin 7 and the longitudinal cavity 11 is such that it allows the spindle to follow the rotation of the pin 7 about its own axis.

With reference to FIG. 1, the finishing line 1 comprises a painting machine 12, 13 operatively positioned along the transfer path 4. The machine for painting small three-dimensional objects illustrated in FIG. 1 may be used independently of the finishing line, as for example illustrated in FIGS. 2 to 4.

With reference to the embodiment illustrated for example in FIG. 1, the finishing line 1 comprises two painting machines 12, 13 operatively positioned along the transfer path 4. In a finishing process for example by means of metallization, the first machine is used for applying the 1a primer, whilst the second machine is used for applying a protective layer.

In the example illustrated in FIG. 1 the two painting machines 12, 13 are positioned in the direction of travel F respectively upstream and downstream of a metallizing device 14 operatively positioned along the transfer path 4.

Alternatively, one or both of the painting machines may be omitted.

Figure 2:
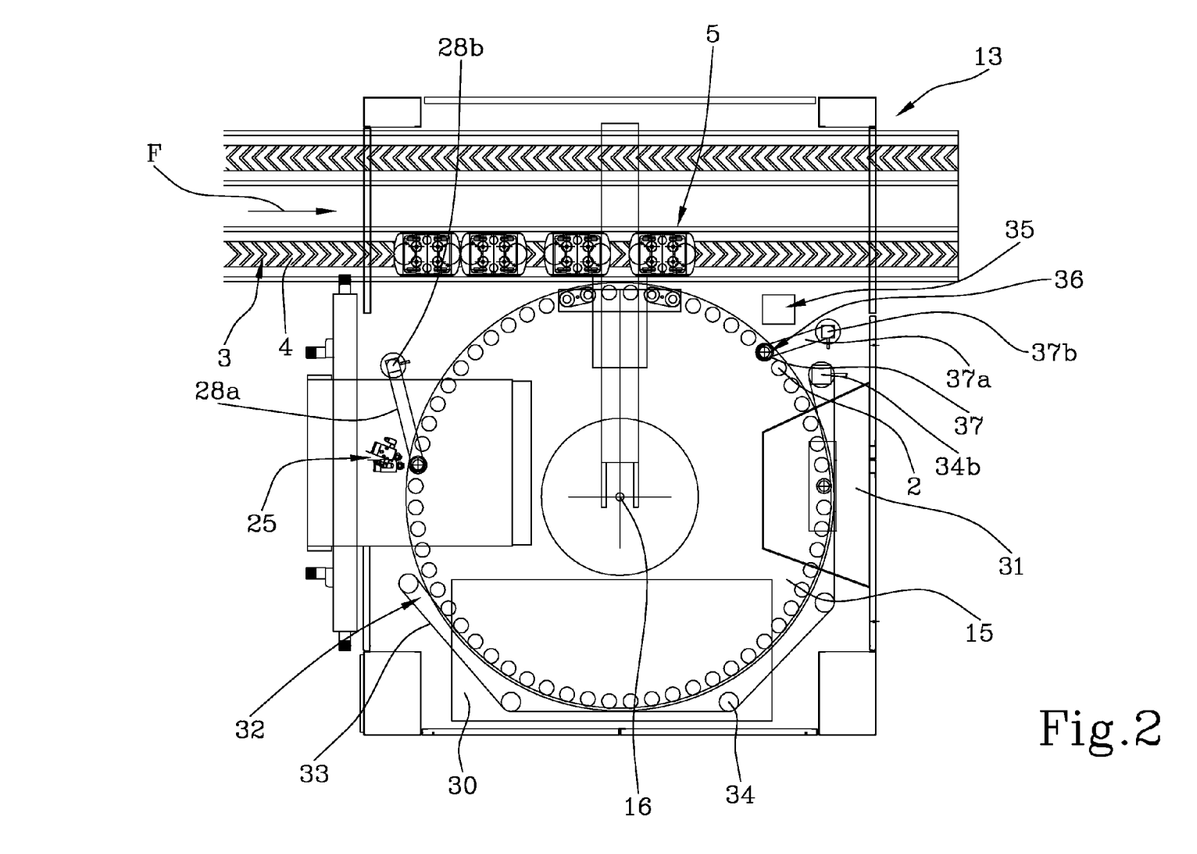
FIG. 2 is a schematic top view of a painting machine in particular as an enlarged detail of FIG. 1.
Figure 3:
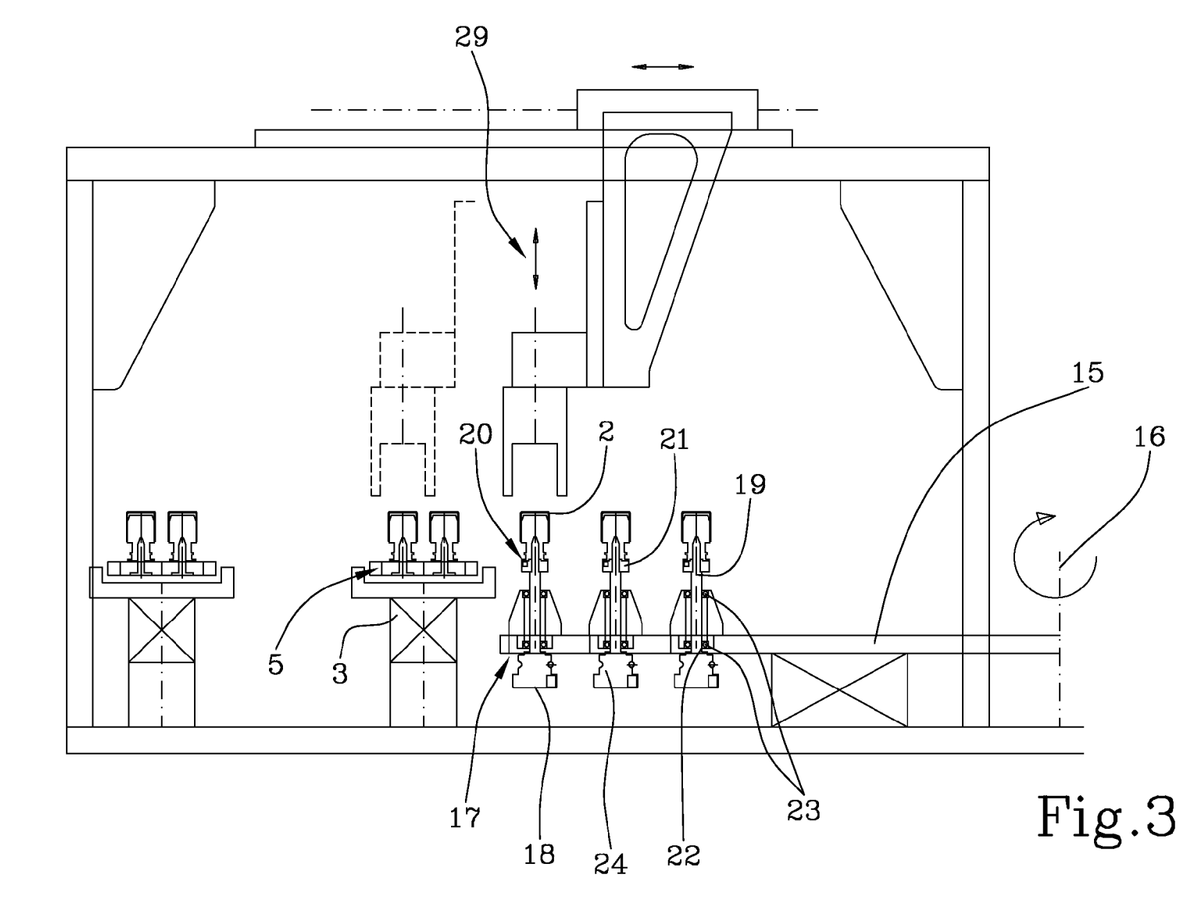
FIG. 3 is a schematic side view of several elements of the painting machine of FIG. 2.
Figure 4:
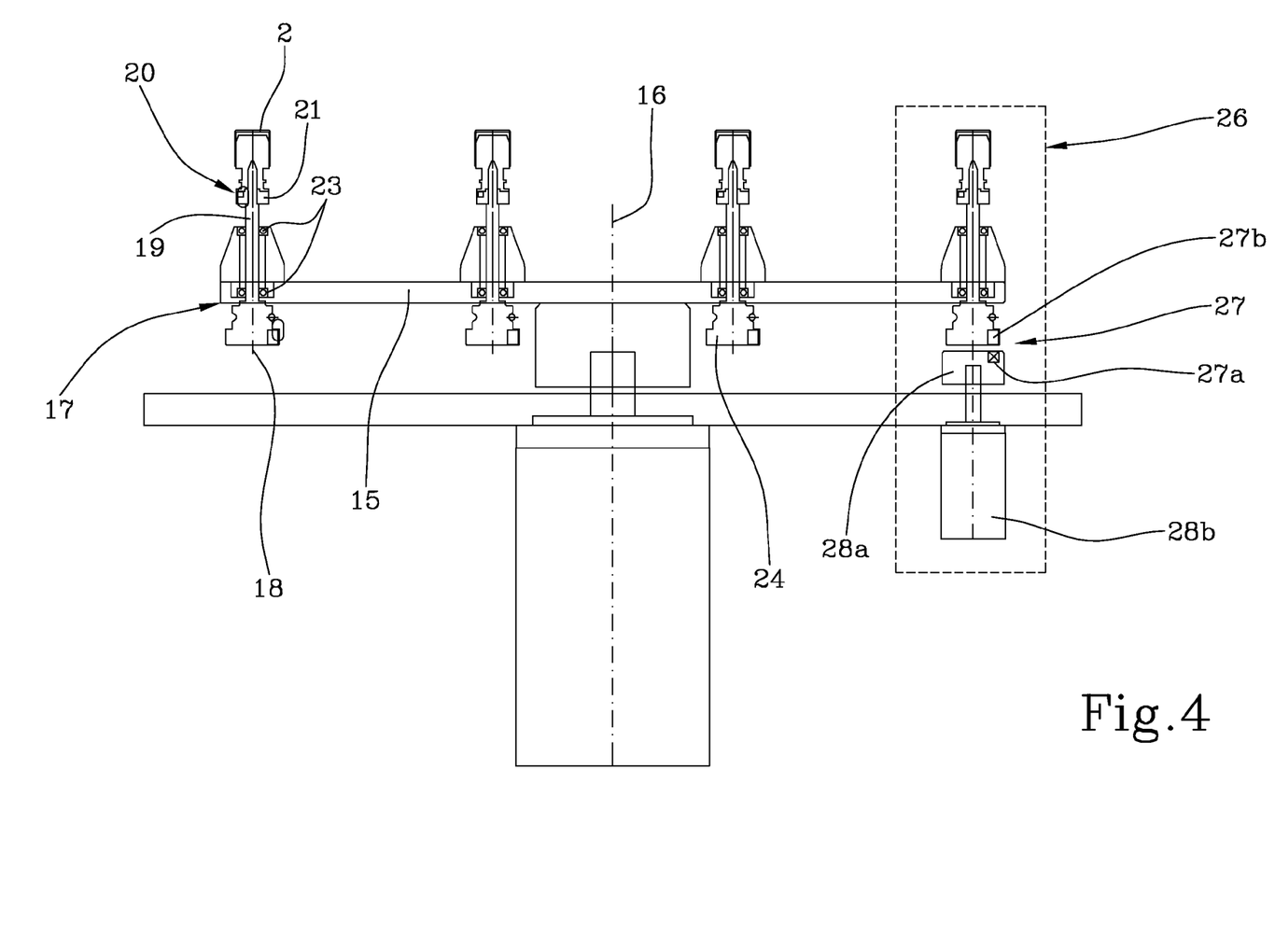
FIG. 4 is a schematic side view of several elements of the painting machine of FIG. 2.
Figure 5:
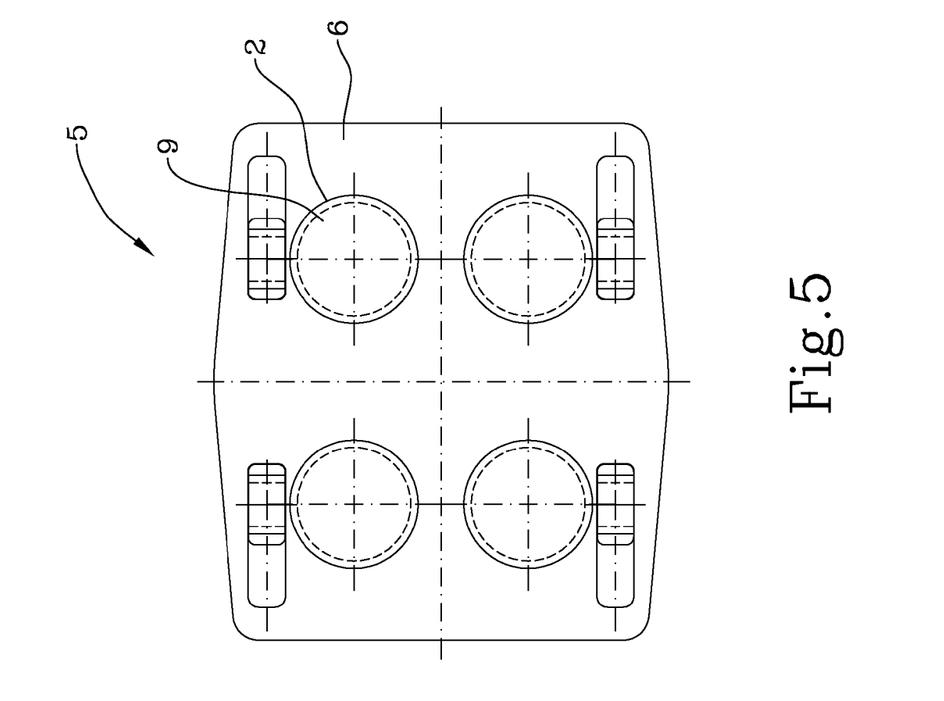
FIG. 5 is a schematic top view of a detail of the line of FIG. 1 and/or of the machine of FIG. 2.
Figure 6:
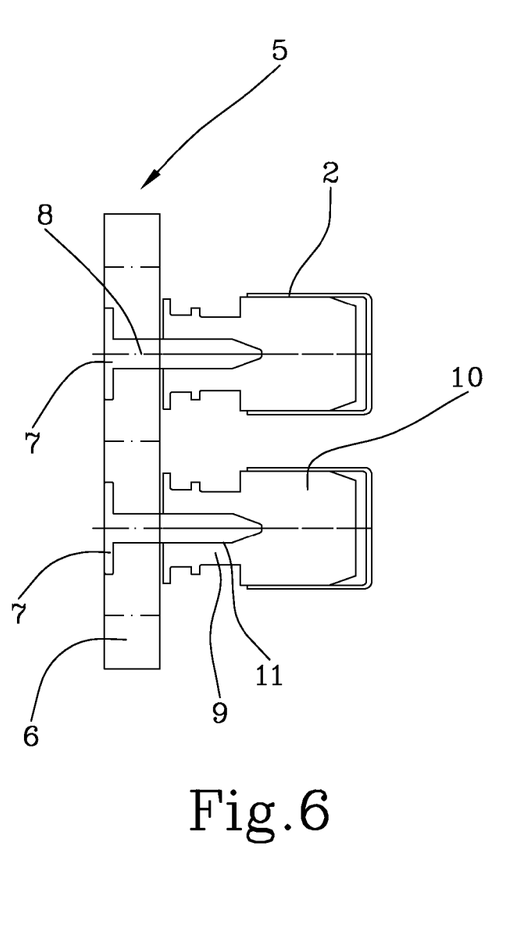
FIG. 6 is a side view in cross-section of the detail of FIG. 5.
Figure 7:
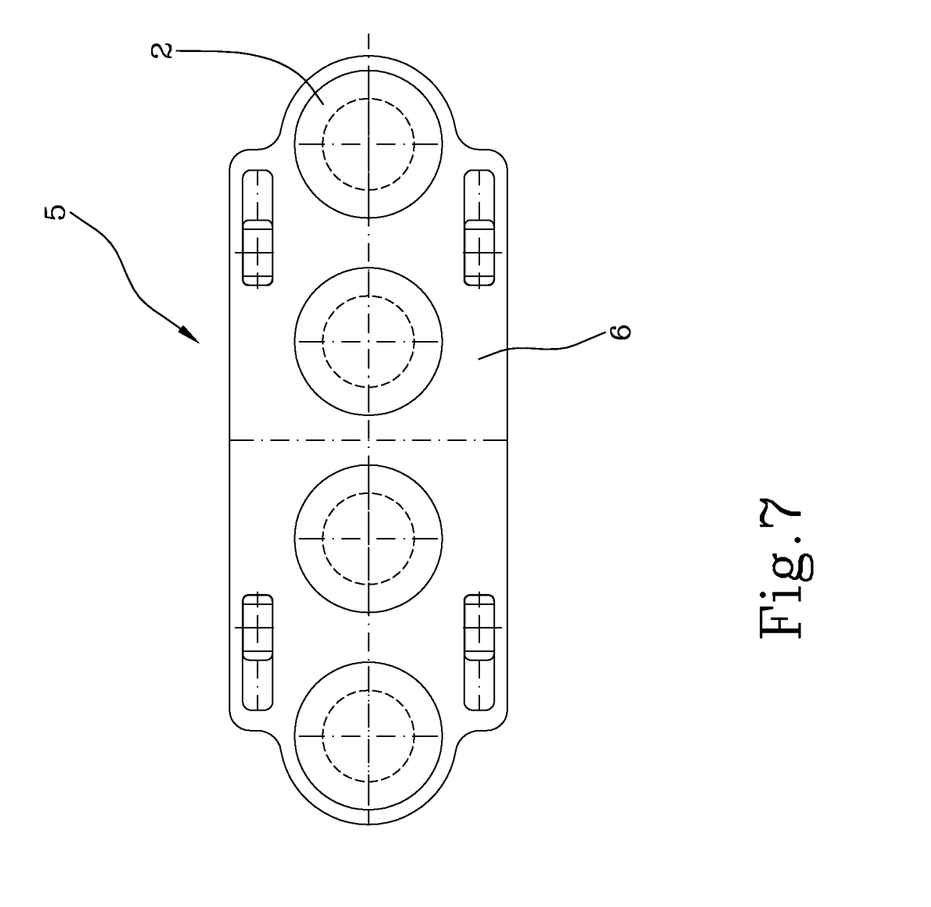
FIG. 7 is a schematic top view of one possible embodiment of a detail of the line of FIG. 1 and/or of the machine of FIG. 2.
Figure 8:
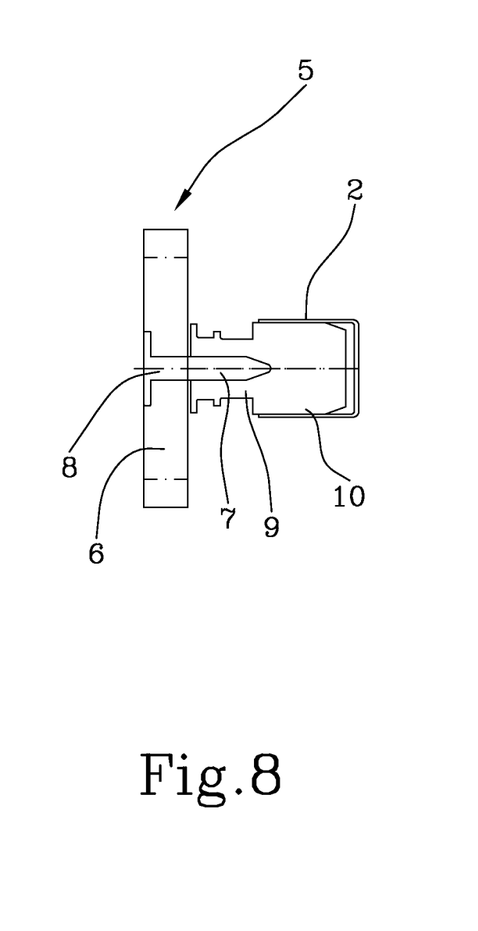
FIG. 8 is a side view in cross-section of the detail of FIG. 7.

FIGS. 2 to 4 show details of a painting machine, in particular of a painting machine 13 for example designed to be positioned downstream of a metallizing device.

The numeral 15 denotes a unit which rotates about an axis 16. In particular, a rotary table can be used. The axis 16 is positioned vertically with reference to the normal positioning in a horizontal plane of the finishing line in FIG. 1. Alternatively, the axis 16 may be set at an angle relative to the vertical line or positioned horizontally (therefore, with the rotary unit substantially vertical).

The rotary unit 15 comprises a plurality of seats 17.

The seats 17 are distributed in a circle about the axis 16. The seats 17 can move, following the rotation of the rotary unit 15 about its own axis 16, in a predetermined direction of travel F' of a circular path concentric with the axis 16.

Each seat 17 is structured in such a way that it can receive a spindle 9. The coupling between the seat 17 and the spindle is such that it allows, relative to the rotary unit 15, rotation of the object 2 to be painted about a painting axis 18 able to move along the circular path defined by the rotary unit. In particular, the coupling between the seat 17 and the spindle is such that it allows rotation of the spindle 9 about the painting axis 18, driving the rotation of the object to be painted.

The spindle 9 is removably associable with a respective seat 17 of the rotary unit. One possible embodiment comprises a magnetic coupling operating between a spindle 9 and the respective seat 17 of the rotary unit 15 with which said spindle is associated.

The numeral 19 denotes a peg of a seat 17 forming an element for driving the object to be painted, in particular for the spindle.

The peg 19 is designed to be driven to rotate about the painting axis 18 which coincides with the axis along which said peg extends.

A longitudinal cavity 11 of the spindle is designed to receive a portion of the peg 19 projecting from the upper surface of the rotary unit. The peg 19 and the longitudinal cavity 11 are positioned coaxially with the painting axis 18.

The coupling between the peg 19 and the longitudinal cavity 11 may be such that it allows the spindle to follow the rotation of the peg 19 about the painting axis.

A magnetic coupling 20 renders the spindle 9 (or at least the holder 10) fixed as one to the peg 19 at least in the rotating motion about the painting axis 18.

The numeral 21 denotes a supporting base for the spindle. The supporting base 21 is fixed as one to the peg 19 in the rotating motion about the painting axis 18. Preferably, the supporting base 21 comprises a coupling, preferably the magnetic coupling 20, between the spindle 9 and the seat 17. Said coupling is designed to render the spindle 9 fixed as one to the supporting base 21 at least in the rotating motion about the painting axis 18.

With reference to one possible embodiment for example illustrated in FIGS. 3 and 4, the seat 17 is formed by a through hole 22 in a rotary table and by peg 19 supporting means equipped with bearings 23.

For each seat 17 there may be a pulley 24 designed to be fixed as one to the spindle 9 in its rotating motion about the painting axis 18. The pulley 24 is fixed to the peg 19 in particular at the opposite end to the spindle 9.

Along the circular path formed by the seats 17 there is at least one airless painting device 25 operating on an object to be painted at least at one painting station 26 designed to receive the seats 17 in sequence. There may be two or more painting devices suitable for completing painting of the same object in the same painting station or in different painting stations. There may be two or more painting devices suitable for painting the same portions of two different objects in different painting stations.

There may be means for adjusting the position of the painting device suitable for adjusting the distance and/or the angle of the painting device relative to the rotary unit, for example depending on the shape and/or the dimensions of the objects to be painted. There may be means for adjusting the position of the painting device suitable for adjusting the distance and/or the angle of the painting device relative to the rotary unit during the painting step.

The numeral 27 denotes first actuator means structured in such a way as to drive the rotation about said painting axis 18 of the spindle 9 (or at least the holder 10 of the object to be painted) associated with a respective seat 17 of the rotary unit 15 when said seat is positioned at the painting station 26.

According to one embodiment illustrated by way of example, the first actuator means 27 comprise magnetic driving means. A first portion 27a of the magnetic driving means, for example a magnet, is associated with a driving part 28. The driving part 28 is positioned at the painting station and is preferably stationary relative to the rotary unit 15. In particular, the driving part 28 is a pulley driven by a belt 28a below the rotary unit 15 along the path followed by the seats 17. The numeral 28b denotes the motor which drives the belt 28a and the driving part 28.

A second portion 27b of the magnetic driving means, for example a metal contact element, is associated with the seat 17 and/or the spindle 9.

If the pulley 24 is present, the second portion 27b of the magnetic driving means may be associated with the pulley 24.

The numeral 29 denotes means for transferring the objects, structured in such a way as to grip the spindle 9 positioned along the transfer line 3 and place it in one of the seats and/or vice versa. The transfer means are positioned upstream and/or downstream of the painting device 25 in the direction of travel F'. In the embodiment illustrated, the transfer means grip the spindle 9 from the tray 5 and from the pin 7 for transferring it to a seat 17 of the rotary unit, on the peg 19.

The painting machine 12 may comprise a further processing station, comprising for example an infrared oven 30 and/or a UV ray drier 31 for the abatement of any small fraction of solvent present in the paint. The further processing station is operatively positioned along the circular path followed by the seats 17, downstream of the airless painting station in the direction of travel F'. In the embodiment illustrated both the infrared oven 30 and the UV ray drier 31 are present one after another. It should be noticed that cap exposure to infrared rays and/or UV rays takes place for around few seconds (2 to 4 seconds).

The numeral 32 denotes second actuator means structured in such a way as to drive the rotation about the painting axis 18 of the spindle 9 (or at least the holder of each spindle) associated with a respective seat at least when said seat is positioned at a further processing station, for example an infrared oven 30 and/or a UV ray drier 31. The second actuator means comprise the pulley 24 associated with each seat 17 described above and a driving unit 33, for example a belt driven by rollers 34 which are mounted on the machine at the further processing station. If necessary, the driving unit 33 may extend between two or more further processing stations as in the example illustrated. The numeral 34b denotes a motor which drives the belt 33.

The numeral 35 denotes visual inspection means, for example a video camera, positioned along the circular path downstream of said airless painting device in the direction of travel F'. In particular, the visual inspection means 35 are positioned downstream of all of the painting machine processing stations, for example the infrared oven 30 and/or the UV ray drier 31.

The numeral 36 denotes third actuator means structured in such a way as to drive the rotation about the painting axis 18 of the spindle 9 (or at least the holder of each spindle) associated with the respective seat 17 when it is positioned at the visual inspection means 35. The third actuator means for example comprise magnetic driving means comprising a first portion, for example a magnet, associated with a driving part 37 positioned at the visual inspection means and a second portion associated with the seat and/or with the spindle. The second portion may be the same used in the first magnetic driving means. In particular, the third actuator means are substantially similar to the first actuator means. In particular, the driving part 37 may be a pulley driven by a belt 37a below the rotary unit 15 along the path followed by the seats 17. The numeral 37b denotes the motor which drives the belt 37a and the driving part 37.

In the case of a line for finishing by metallization comprising two painting machines, the visual inspection means and the third actuator means can only be located on the painting machine downstream of the metallizing device.

A method for painting small three-dimensional objects according to the invention can be implemented by a painting machine as described above. In particular, a method for painting small three-dimensional objects according to the invention comprises the steps of:
  preparing a plurality of spindles 9 along a transfer line 3, each spindle holding a single object 2;
  gripping each spindle 9 and transferring it to a respective seat 17 of a plurality of seats of a unit 15 rotating about an axis 16 and/or vice versa;
  rotating said rotary unit 15 about said axis 16 forming a circular path of said seats 17;
  using an airless painting device 25 to paint the objects at a painting station 26 positioned along the circular path, driving the rotation, relative to the rotary unit 15, of the spindle 9 or at least a holder 11 of the spindle 9 about a painting axis 18.

The painting machine and method according to the invention achieve the preset aims, since an independent module is obtained, which can be inserted in any finishing line, in particular for metallization, since the objects are handled with their own spindle. This also makes it possible to avoid touching the object during painting and any further processing steps. Moreover, it prevents the painting or contamination of other supporting elements such as the tray, allowing insertion directly in the metallizing device.

Moreover, by providing magnetic driving means for the spindle on the seat and/or for the peg of the seat, it is possible to reach high object speeds of rotation for the airless painting device. That allows ample operating versatility which can be adapted to any production process.

Figure 9:
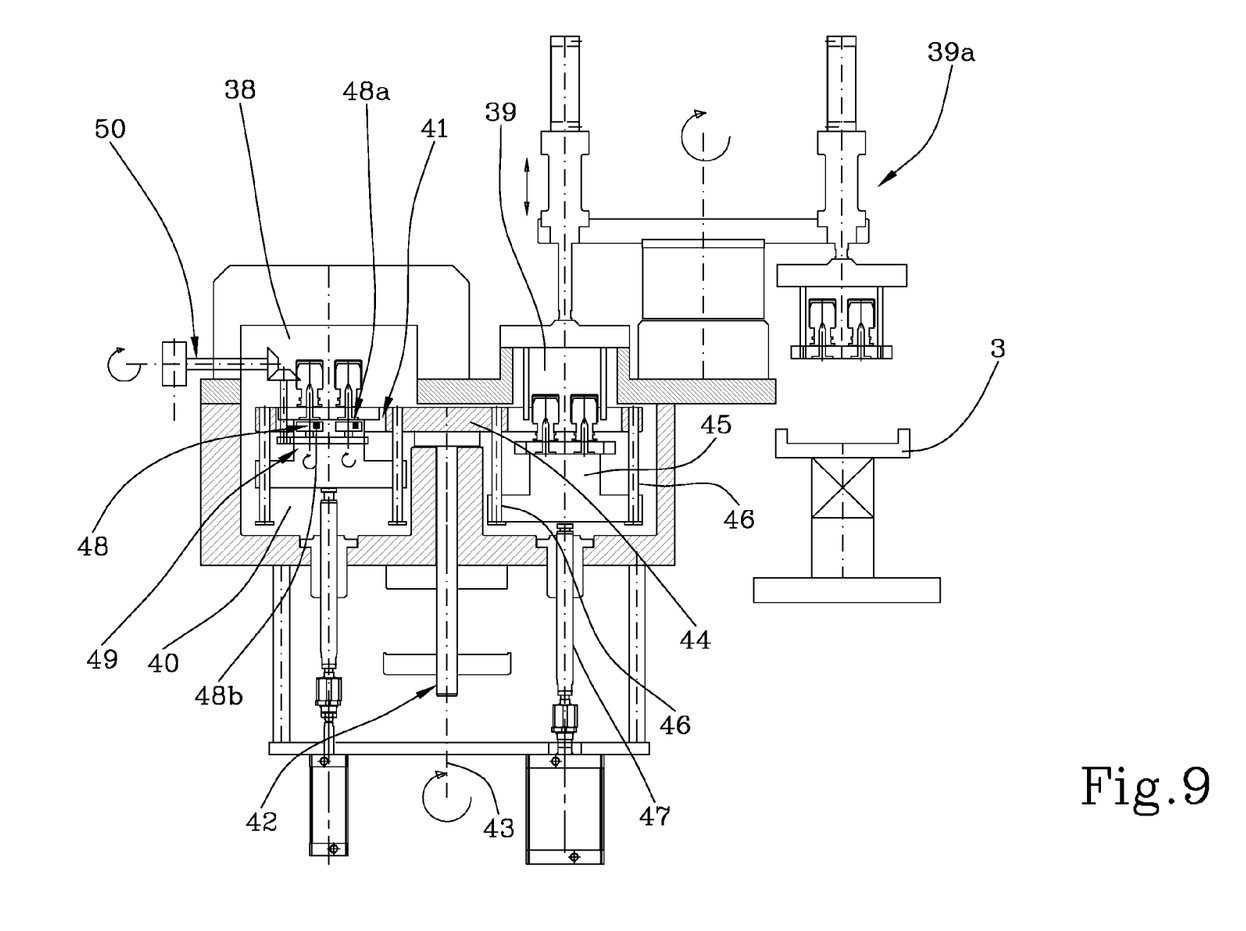
FIG. 9 is a schematic side view in cross-section of a metallizing device in particular as an enlarged detail of FIG. 1.

In the line for finishing by means of metallization, in particular if used with one or more painting machines as described above, the metallizing device 14 for example illustrated in FIG. 9 performs metallization with a sputtering technique. A main sputtering chamber is labelled 38. The main sputtering chamber 38 is in a permanent vacuum condition for coating each object with a predetermined metal layer. The numeral 39 denotes a pre-chamber for loading and unloading, which can be switched between a vacuum condition and an ambient pressure condition, and which is operatively associated with the main chamber.

Transfer means 39a for transferring a tray 5 from the transfer line 3 to the metallizing device and vice versa are structured in such a way as to grip a tray 5 and position it in the pre-chamber 39 and vice versa.

An intermediate chamber 40 is positioned upstream of the main chamber 38 and is also kept in a constant strong vacuum.

The intermediate chamber 40 is in fluid communication with the main chamber 38 through a transit opening 41.

The intermediate chamber 40 is in turn connected to the pre-chamber 39 for loading and unloading which is designed to insert in the intermediate chamber 40 the trays 5 carrying the spindles and the objects to be metallized.

In other words, the pre-chamber 39 for loading and unloading allows access to the intermediate chamber 40. The pre-chamber 39 can be switched between a vacuum condition and an ambient pressure condition, to allow controlled insertion of each tray into the main chamber 38 (through the intermediate chamber 40).

With each processing cycle, only the pre-chamber for loading and unloading has to be depressurised. Its volume is much less than that of the main chamber and the intermediate chamber, minimising the energy needed for each processing cycle and minimising the time for which the tray is inside the main metallizing chamber 38.

The time for which each cap is present inside the metallizing device 14 is just a few seconds, that is to say 2-4 seconds.

The metallizing device 14 also comprises internal movement means 42 positioned in the intermediate chamber 39 for transferring each tray 5 from the pre-chamber 39 to the main chamber 38 and, at the same time, for returning the tray with the metallized objects from the main chamber to an area close to the pre-chamber.

In the embodiment described, the intermediate chamber 40 has a substantially toroidal shape. The main chamber 38 is positioned on the side diametrically opposed to the pre-chamber 39 relative to an axis of symmetry 43 of the intermediate chamber 40.

The internal movement means 42 comprise a carrousel 44 which rotates about an axis coinciding with the axis of symmetry 43 of the intermediate chamber 40.

The carrousel 44 comprises at least two diametrically opposed sustaining elements 45 for transporting, each on separate paths, each tray 5 from and to the main chamber 38. Each sustaining element 45 can move along a respective circular trajectory.

Moreover, each sustaining element 45 can move in a direction parallel with the axis of rotation of the carrousel 44 to move each tray 5 between a first position at the pre-chamber 39 and/or at the transit opening 41 and a second position, distal and lowered, in which each tray is moved circularly in the intermediate chamber 40.

Each sustaining element 45 can slide along guides 46 which are fixed to a rotary portion of the carrousel 44. Actuator means 47 are associated with each sustaining element 45 for translating it in the direction parallel with the axis of rotation of the carrousel 44. By way of example, said actuator means 47 are hydraulic cylinders which can be activated on the sustaining elements 45 when the latter must be translated in the above-mentioned direction parallel with the axis of rotation of the carrousel 44.

As described above with reference to FIGS. 5 to 8, each spindle 9 is associated with a respective tray 5 by means of a coupling which leaves the spindle free to rotate about a sputtering axis relative to the tray 5. The axis of symmetry 9 of the pin 7 coincides with the above-mentioned sputtering axis.

The numeral 48 denotes magnetic transmission means for driving the rotation of each spindle relative to the respective tray at least inside the main sputtering chamber 38. The magnetic transmission means comprise a first portion 48a associated with the spindle or with the spindle supporting pin 7 and a second portion 48b associated with an element of a kinematic chain which is completed and operates inside the main sputtering chamber 38. The first and second portions may be a magnet and a metal contact element respectively.

In particular, the sustaining elements 45 comprise gears 49 fixed to the second portion 48b of the magnetic transmission means and designed to be driven to rotate by a kinematic chain 50 associated with the main chamber 38.

In use, the metallizing device 14 receives the trays arriving from the transfer line 3 by means of the transfer means 39a.

The tray is positioned in the pre-chamber 39 resting on the sustaining element 45. The actuator means 47 lower the sustaining element with the tray. The carrousel 44 is driven to rotate about the axis 43 until the tray is close to the transit opening 41. The actuator means 47 raise the sustaining element with the tray, inserting it in the main chamber 38.

The gears 49 complete the kinematic chain 50, driving the rotation of the spindles on the tray during the actual metallization step.

A method for finishing small three-dimensional objects for example implemented with the finishing line described above comprises the steps of:
  transferring a plurality of trays 5 along a transfer path 4, each tray 5 being designed to receive one or more objects 2,
  painting the objects 2 picked up from the trays 5 along the transfer path 4, in particular by applying the painting method described above, and putting the painted objects back on the trays 5;
  transferring the trays 5 from the transfer path 4 to a metallizing device 14 before and/or after painting, said metallizing device 14 comprising a main sputtering chamber 38 kept in a permanent vacuum condition for coating each object with a predetermined metallic layer and a pre-chamber 39 for loading and unloading, said pre-chamber being switchable between a vacuum condition and an ambient pressure condition, and being operatively associated with said main chamber 38.

The finishing line and method described above allow the process to be made very flexible, making the painting step independent of the metallization step with reference to the type and number of objects to be processed.

That effect is further increased by the use of a painting machine which directly handles the spindle that supports the part.

In particular, use of the tray only during the metallization step allows an increase in productivity and avoids maintenance work resulting from paint build-up on the trays.

According to a different embodiment, each tray is designed to transport at least one object. In particular, each tray comprises at least one pin for receiving a spindle supporting the object to be painted/metallized.

According to a different embodiment at least the holder of the spindle designed to receive the object to be painted rotates about the painting axis.

The invention claimed is:

1. A finishing line for small three-dimensional objects comprising:
   a transfer line of the objects, wherein said transfer line forms a transfer path;
   a plurality of trays able to move along the transfer line, each tray being designed to removably receive a plurality of spindles, each spindle of said plurality of spindles comprising a holder configured for removably engaging a single one of said objects;
   a painting machine operatively positioned along the transfer path;
   wherein said painting machine comprises a plurality of seats, each seat of said plurality of seats being structured to removably receive one of said spindles allowing rotation of the respective holder about a painting axis, said spindle being removably associable with said seat;
   transfer means structured in such a way as to grip a spindle and place it in one of the seats and vice versa, for transferring the objects from the tray to the machine for painting, and vice versa;
   a metallizing device operatively positioned along the transfer path downstream and/or upstream of the painting machine in a direction of travel of the transfer path, wherein said metallizing device comprises a main sputtering chamber which is kept in a permanent vacuum condition for coating each object with a predetermined metallic layer, and a pre-chamber for loading and unloading, the latter being switchable between a vacuum condition and an ambient pressure condition, and operatively associated with said main chamber;
   transfer means for transferring a tray from the transfer line to the metallizing device and vice versa, said tray transfer means being structured in such a way as to grip a tray and position it in the pre-chamber and vice versa.

2. The finishing line according to claim 1, wherein the spindle is associated with a respective tray by means of a coupling which leaves the spindle free to rotate about a sputtering axis relative to the tray.

3. The finishing line according to claim 2, comprising magnetic transmission means for driving the rotation of each spindle relative to the respective tray at least inside the main sputtering chamber.

4. The finishing line according to claim 3, wherein said magnetic transmission means comprise a first portion associated with the spindle or with a spindle supporting pin and a second portion associated with an element of a kinematic chain which is completed and operates inside the main sputtering chamber.

5. A method for finishing small three-dimensional objects comprising:
   providing a plurality of trays;
   removably engaging on each tray a plurality of spindles, wherein each spindle removably engages a single object to be painted;
   transferring the trays along a transfer path;
   picking up the objects from the trays along the transfer path, by gripping each spindle and transferring said spindle, carrying the respective object, to a respective seat of a plurality of seats;
   painting the objects and putting the painted objects back on the trays;
   transferring the trays from the transfer path to a metallizing device before and/or after painting, said metallizing device comprising a main sputtering chamber kept in a permanent vacuum condition for coating each object with a predetermined metallic layer and a pre-chamber for loading and unloading, said pre-chamber being switchable between a vacuum condition and an ambient pressure condition, and being operatively associated with said main chamber.

6. The finishing line according to claim 1, wherein said painting machine comprises:
   a plurality of spindles, each spindle of said plurality comprising a holder configured for removably engaging a single object to be painted;
   a rotary unit able to rotate about an axis and equipped with a plurality of seats which are distributed in a circle around said axis and which can move, following the rotation of the rotary unit, in a predetermined direction of travel of a circular path around said axis,
   wherein each seat of said plurality is structured to removably receive one of said spindles allowing, relative to the rotary unit, rotation at least of the holder for the object to be painted about a painting axis, said spindle being removably associable with said seat;
   at least one painting device operatively positioned along said circular path at least at one painting station designed to receive said seats in sequence;
   first actuator means structured in such a way as to drive the rotation about said painting axis at least of the holder for the object to be painted of each spindle associated with a respective seat of said rotary unit at least when said seat is positioned at the painting station,
   means for transferring the objects, structured in such a way as to grip a spindle positioned along a transfer line and place it in one of the seats and/or vice versa, said transfer means being positioned upstream and/or downstream of said painting device depending on the direction of travel of said path.

7. The method according to claim 5, wherein painting the objects comprises:
   preparing a plurality of spindles along a transfer line, wherein each spindle removably engages a single object to be painted;
   gripping from the transfer line each spindle and transferring said spindle, carrying the respective object, to a respective seat of a plurality of seats of a unit rotating about an axis and/or vice versa;
   rotating said rotary unit about said axis, whereby defining a circular path of said seats;
   using a painting device to paint the objects at a painting station positioned along said circular path, while driving the rotation, relative to the rotary unit, of at least one holder of said spindle about a painting axis.

8. The finishing line according to claim 6, comprising a magnetic coupling operating between a spindle and the respective seat of the rotary unit with which said spindle is associated.

9. The finishing line according to claim 6, wherein said seat comprises a driving element, at least said holder of said spindle associated with said seat being fixed to said driving element at least in the rotating motion about said painting axis, by means of a magnetic coupling.

10. The finishing line according to claim 9, comprising a supporting base for the spindle, wherein said supporting base is fixed to said driving element in the rotating motion about said painting axis and comprises a magnetic coupling with at least said holder of said spindle, said coupling being designed to render the spindle fixed to the supporting base at least in the rotating motion about said painting axis.

11. The finishing line according to claim 6, wherein a spindle is associated with a respective seat by means of a coupling between a peg positioned coaxially relative to said painting axis and a longitudinal cavity positioned coaxially relative to said painting axis.

12. The finishing line according to claim 11, wherein said seat comprises said peg designed to be driven to rotate about said painting axis by said first actuator means and wherein said holder of said spindle comprises said longitudinal cavity, said holder of said spindle being rendered fixed to said peg at least in the rotating motion about said painting axis.

13. The finishing line according to claim 6, wherein said first actuator means comprise magnetic driving means comprising a first portion associated with a driving part positioned at said painting station and a second portion associated with said seat and/or with said spindle for driving the rotation about said painting axis of the holder of each spindle associated with the respective seat when it is positioned in the painting station.

14. The finishing line according to claim 6, wherein a further processing station, comprises an infrared oven and/or a UV ray drier, operatively positioned along said circular path downstream of said painting device in the direction of travel of said path.

15. The finishing line according to claim 6, comprising pulleys, each pulley for each seat, each pulley being designed to be rendered fixed, in its rotating motion about the painting axis, to the holder of the spindle associated with the respective seat, and second actuator means structured in such a way as to drive the rotation about said painting axis of at least the holder of each spindle associated with a respective seat at least when said seat is positioned at a further processing station, wherein said second actuator means comprise a driving element, extending to one or more of said further processing stations for driving the rotation of the pulleys which pass through said further processing stations, and wherein said first actuator means comprise magnetic driving means with a first portion associated with a driving part positioned at said painting station and a second portion associated with said pulley for driving the rotation about said painting axis of each spindle associated with the respective seat when it is positioned in the painting station.

16. The finishing line according to claim 6, comprising visual inspection means, positioned along said circular path downstream of said painting device in the direction of travel of said circular path.

17. The finishing line according to claim 16, comprising third actuator means structured in such a way as to drive the rotation about said painting axis of at least the holder of each spindle associated with the respective seat when it is at the visual inspection means.

18. The finishing line according to claim 6, wherein said rotary unit is a rotary table.

\* \* \* \* \*